United States Patent [19]

Harrus et al.

[11] Patent Number: 4,980,301
[45] Date of Patent: Dec. 25, 1990

[54] METHOD FOR REDUCING MOBILE ION CONTAMINATION IN SEMICONDUCTOR INTEGRATED CIRCUITS

[75] Inventors: Alain S. Harrus, Philadelphia; Graham W. Hills, Salisbury; Cris W. Lawrence, Allentown; Morgan J. Thoma, Macungie, all of Pa.

[73] Assignee: AT&T Bell Laboratories, Murray Hill, N.J.

[21] Appl. No.: 485,804

[22] Filed: Feb. 23, 1990

Related U.S. Application Data

[63] Continuation of Ser. No. 287,972, Dec. 21, 1988, abandoned.

[51] Int. Cl.$^5$ .......................................... H01L 21/306
[52] U.S. Cl. .......................................... 437/12; 437/62; 437/190
[58] Field of Search ............................ 437/12, 190, 62

[56] References Cited

U.S. PATENT DOCUMENTS

| 4,102,733 | 7/1978 | DeLa Moneda et al. | 437/190 |
| 4,361,599 | 11/1982 | Wourms | 437/190 |
| 4,520,554 | 6/1985 | Fisher | 437/190 |
| 4,690,728 | 9/1987 | Tsang et al. | 437/190 |
| 4,732,865 | 3/1988 | Evans et al. | 437/192 |
| 4,755,480 | 7/1988 | Yau et al. | 437/190 |
| 4,780,431 | 10/1988 | Maggini et al. | 437/190 |
| 4,795,722 | 1/1989 | Welch et al. | 437/192 |
| 4,810,673 | 3/1989 | Freeman | 437/235 |

FOREIGN PATENT DOCUMENTS 56-83977 7/1981 Japan .
193324 10/1985 Japan .

OTHER PUBLICATIONS

*VLSI Technology*, Sze, S. editor; McGraw-Hill Book Co., N.Y. (1983), p. 336.

Primary Examiner—Olik Chaudhuri
Assistant Examiner—Andrew Griffith
Attorney, Agent, or Firm—James H. Fox

[57] ABSTRACT

In a method of fabricating semiconductor integrated circuits, the effects of mobile ion contamination in a dielectric layer which has been subjected to a source of mobile ion contamination, e.g., reactive ion etching, is substantially eliminated by removing substantially only the topmost portion of the dielectric layer, e.g., 10-15 nm of an 800 nm layer, promptly after performing the step which produced the source of contamination.

6 Claims, 1 Drawing Sheet

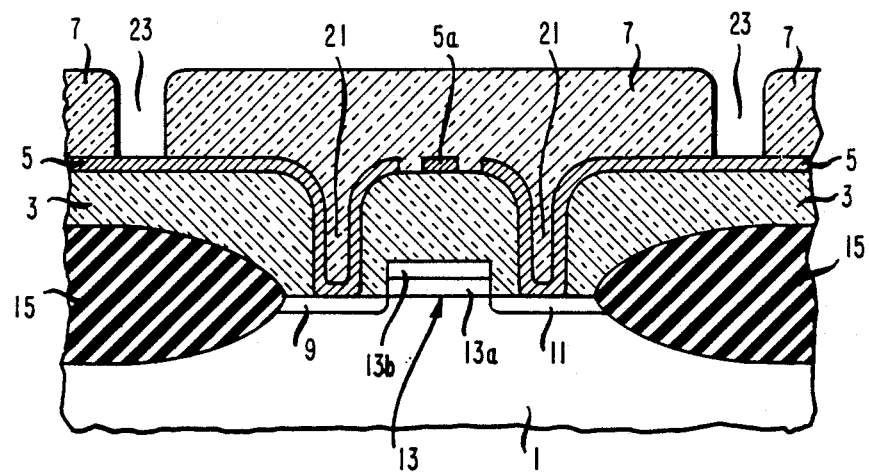

METHOD FOR REDUCING MOBILE ION CONTAMINATION IN SEMICONDUCTOR INTEGRATED CIRCUITS

This application is a continuation of application Ser. No. 287,972, filed on Dec. 21, 1988.

TECHNICAL FIELD

This invention relates to a method of semiconductor integrated circuit fabrication comprising a step which reduces the mobile ion contamination in a dielectric layer.

BACKGROUND OF THE INVENTION

As semiconductor integrated circuit devices and uses therefor have become increasingly complicated, it has become more difficult to use a single metal level to make all of the electrical connections to and between the devices in an integrated circuit. The need for multiple levels of interconnecting metallizations has made integrated circuit fabrication more difficult, for several reasons.

For example, it is generally desirable to begin any patterning step with a relatively smooth surface, because a smooth surface facilitates accurate pattern transfer and also facilitates forming continuous portions of metallization patterns thereover. Unfortunately, structures with two or more levels of metals typically have surfaces with complex topography, i.e., nonplanar surfaces. To ameliorate the adverse effects of such nonplanarity, integrated circuit processing sequences typically include a step which provides a smooth surface of, for example, a dielectric. A typical such sequence involves depositing a dielectric layer, such as a glass which is relatively conformal to the nonplanar topography, and then either flowing it or etching it back to form a relatively smooth surface.

Although the aforementioned sequence produces a relatively planar surface, other problems often arise. For example, such a sequence can introduce many possible contaminants which can adversely affect circuit performance, and especially troublesome adverse effects are caused by the presence of contaminants which produce mobile ions, typically sodium ions, in the dielectric layer. Unfortunately, many potential sources of mobile ions are present during semiconductor integrated circuit fabrication, and they are not easily eliminated. As will be readily appreciated by those skilled in the art, such mobile ion contamination often can be at levels which are high enough to result in an undesirably large number of integrated circuit failures or unsatisfactory performance.

Several approaches have been taken heretofore to reduce the effects of contamination. One such approach uses a gettering agent in the contaminated dielectric layer. The gettering agent is effective, after heating the dielectric layer to a sufficiently elevated temperature, typically greater than about 800° C., to reduce the effects of contaminants by trapping and holding them in the form of stable, charge-neutralized compounds. This technique is often used with a phosphorus-containing dielectric layer deposited prior to the first level metal. Such a dielectric typically flows at temperatures within a range between about 800° C. to 1000° C. At these temperatures, the phosphorus present in the dielectric layer acts as a gettering agent for mobile ions which are present therein.

In contemporary integrated circuit fabrication, several levels of metal may be deposited, and each deposition step typically is followed by pattern delineation. However, the material properties of the first level metal typically dictate a temperature, e.g., about 450° C. for aluminum, which cannot be exceeded during the remainder of the process sequence without destroying the integrity of the first level metal. Unfortunately, this maximum temperature is much lower than the 800° C. to 1000° C. temperature which is effective in the initial flowing and gettering process, i.e., prior to the first level metal.

It will be readily appreciated that many of the sources of mobile ion contamination necessarily occur at processing steps subsequent to forming the first level metal. Thus, due to the limitation on the maximum temperature imposed by the material properties of the first level metal, the above-described gettering step, which was used to neutralize contamination from the first level dielectric before forming the first level metal, typically cannot be used to remove mobile ions from subsequently deposited dielectric layers.

SUMMARY OF THE INVENTION

In a method of semiconductor integrated circuit fabrication, mobile ion contamination in a deposited dielectric layer is reduced, in accordance with an illustrative embodiment of this invention, by removing only the surface portion of the layer, e.g., less than approximately the top 100 nm of the layer, after performing a processing step which exposes the dielectric layer to a mobile ion contaminant source.

In a preferred embodiment, less than 40 nm are removed from the surface of a second dielectric layer disposed above a first dielectric layer having a plurality of first level metal portions on the surface thereof, i.e., the metal portions are disposed at the interface between the two layers. This removing may be accomplished, for example, by wet etching, after a processing step such as reactive ion etching, which exposes the second dielectric layer to a mobile ion contaminant source. Typically, the mobile ion contaminants removed by the present technique are primarily sodium ions.

The effectiveness of removing only the surface portion of such a second dielectric layer in reducing mobile ion contamination is surprising because it was not known heretofore that processing steps such as reactive ion etching were sources of significant amounts of mobile ion contamination, nor that the mobile ions are concentrated primarily in the topmost portion of the exposed dielectric. Rather, workers in the art expected that mobile ion contamination would be distributed relatively uniformly throughout the dielectric layer(s) due to the processing parameters, typically voltage and temperature, used in the step that produces the contamination. However, the applied bias and temperature during reactive ion etching, or other processing step, apparently are not sufficient to drive the mobile ions further into the dielectric. In fact, it is now theorized that the top region of the dielectric may act as a mild gettering agent, thus keeping the mobile ions near the surface.

BRIEF DESCRIPTION OF THE DRAWING

The FIGURE is a somewhat schematic sectional view of a device which is useful in describing an illustrative embodiment of the method of the invention.

It will be appreciated that for simplicity and clarity of explanation the FIGURE has not been drawn to scale.

DETAILED DESCRIPTION

An illustrative embodiment of the invention will be described in detail by reference to a typical integrated circuit device fabrication sequence. Modifications, both of the sequence and of the integrated circuit device, will be readily apparent to those skilled in the art after reading this description.

The now conventional device depicted in the FIGURE has a substrate 1; first dielectric layer 3 (typically a Boron-Phosphorous-Silicate-Glass ("BPSG") produced by a commonly used silane-based low pressure chemical vapor deposition), first level metal portions 5, and a second dielectric layer 7. Also depicted are typical device features including source 9 and drain 11 regions of an MOS transistor, as well as a gate structure 13, typically including gate oxide portion 13a and polysilicon 13b. Also depicted is a conventional field oxide isolation region 15.

Dielectric layer 7 includes windows 23 which communicate with first level metal portions 5, and through which a second level of metal (not shown), generally on the surface of layer 7, can extend into contact with first level metal portions 5. Source and drain regions are contacted through windows 21 in dielectric layer 3 by selected ones of the first level metal portions 5 extending into physical and electrical contact with the source and drain regions, in a manner well known in the art. The metal portion 5a, overlying and separated from the gate structure 13, is just another one of the metal portions 5 and may be simply a conductive runner interconnecting other devices (not shown), or may be connected to the gate polysilicon 13b at a portion of the device not seen in the sectional view of the FIGURE, all in a manner well known in the art.

It should be understood that the term "substrate" is used herein to mean any of a wide variety of structures and materials, typically including silicon, all of which are well known to those in the art. It will be readily appreciated that many devices typically are present in the integrated circuit device, although only portions of one are depicted. Fabrication of the above-described structure through the formation of first level metal portions 5 is in accord with techniques well known to those skilled in the art and need not be described in more detail herein.

The second dielectric layer 7 typically may be formed by a plasma-enhanced TEOS process to produce a layer conventionally referred to as PETEOS. PETEOS layer 7 typically may be formed to a considerable thickness, e.g., 2500 nm, and then "etched back" to achieve relative planarity and smoothness in the final layer 7, which typically has a final thickness than about 600 nm, typically nominally 800 nm. As indicated, the second dielectric layer 7 is then patterned to open windows 23 which expose selected portions of the first metal and first dielectric. The patterning typically is accomplished by anisotropic etching, such as reactive ion etching or another form of plasma etching. These types of etching, including the etchback referred to above, as well as conventional photoresists and the materials typically included in the equipment used to perform the processes, have been found to introduce significant mobile ion contamination into the dielectric layer.

As is well known, mobile ions in a dielectric layer over a silicon substrate, such as substrat 1 shown in the FIGURE, can readily migrate under the influence of applied voltages and elevated temperatures, e.g., to the interface between BPSG dielectric layer 3 and PETEOS dielectric layer 7 and can induce current leakage paths (not illustrated in the FIGURE) under the field oxide isolation regions 15. Such leakage paths often have deleterious effects on inter-device electrical isolation and can easily lead to effectively complete short circuits between adjacent devices.

However, it is believed not to have been known heretofore that, with processing as described above, unavoidable and significant additional mobile ion contamination also results from the described processing steps and that such additional contamination is concentrated in the topmost surface portion of layer 7 immediately following the processing step which produced the contamination.

It has now been first discovered, through both Secondary Ion Mass Microscopy analysis and Auger spectrum analysis, that, a final 800 nm PETEOS layer formed as described above, substantially all, i.e., greater than about 95%, of the mobile ion contaminants are concentrated, initially after the processing step which produces such contamination, in the topmost 10-100 nm of the layer, typically in the topmost 10-15 nm, rather than being relatively uniformly dispersed throughout the full 800 nm thickness of the layer as would have been expected heretofore by workers in the art.

Having recognized that the contaminants which should be removed are concentrated substantially in the topmost surface portions of the dielectric layer 7, it has been additionally recognized that such contaminants can be removed by the simple expedient of removing substantially only those surface portions. However it is also recognized that it is important to remove those portions before performing any subsequent processing steps involving heat or energy sufficient to cause redistribution of the highly mobile ions throughout the layer. Simply allowing the wafers to sit around at room temperature is not likely to cause any substantial redistribution, but any process step at an elevated temperature or any other step which subjects the wafer to high voltage or other energy, such as ion implantation, reactive ion etching, plasma stripping or various types of photoresist developing steps, could cause significant redistribution.

To remove the topmost surface portions of a contaminated dielectric layer, such as the reactively ion etched dielectric layer 7, one may employ any of a great variety of expedients, as will be apparent to those skilled in the art. A simple and suitable one of such expedients is to wet etch promptly after the step which produces the contaminants. An etch found to be suitable is to use a conventional solution of about 100 parts water to one part hydrofluoric acid ("HF") for about three minutes at room temperature. Such an etch has been found to remove only about 30-45 nm of a PETEOS dielectric layer 7 and to be completely effective in avoiding detectable effects of mobile ion contamination. Although the mobile ion contaminants typically are concentrated in only the top 10-15 nm of the layer, it is preferred to remove about 40 nm to allow for process variability and thereby to ensure more complete removal, as will be understood by those in the art.

Alternatively the topmost surface portions of a dielectric layer can be removed by, for example, wet etching in a solution containing about eight parts of ethylene glycol to one part buffered hydrofluoric acid ("BHF") for about one minute, to remove about 40 nm. Also, wet etching in a solution containing about 30 parts of hydrogen peroxide, five parts ammonium hydroxide and 65 parts water for about 20 minutes has also been found to be effective.

It is to be noted that the removal in accordance with this invention may be accomplished through use of an isotropic etchant, such as the wet etchants heretofore described. This advantageous since it allows the use of wet chemical etchants, such as those heretofore described, which are conveniently and economically obtainable in forms that are relatively free of harmful impurities, and which can accomplish the desired removal relatively simply and at temperatures sufficiently low to avoid any substantial likelihood of introducing additional harmful impurities or other harmful effects.

Of course, other types of etching, including dry processes such as reactive ion etching may also be used, provided care is taken to ensure that the etch process itself does not introduce significant amounts of mobile ion contamination. However, it is theorized that a significant source of the mobile ion contamination which results from reactive ion etch steps is due to sodium and other contaminant residues in the etch chambers from photoresists encountered during selective etch steps. Such residues have been found to be very resistant to complete removal. Accordingly, one method of performing a reactive ion etch step in a manner that will not introduce significant amounts of mobile ion contamination is to provide an etch chamber which has not been exposed to sodium-producing photoresist residues or other mobile ion contaminant-producing residues, and then remove the contaminated topmost portion of a layer in such a chamber, using any of a variety of well-known dry etch techniques.

Although the invention has been described in part by making detailed reference to certain specific embodiments, such detail is intended to be and will be understood to be instructive rather than restrictive. It will be appreciated by those in the art that many variations may be made in the structure and mode of operation without departing from the spirit and scope of the invention as disclosed in the teachings contained herein. For example, it should be apparent that the invention is not limited to use with technologies employing PETEOS dielectric layers, but is equally efficacious with technologies employing other dielectric layers, such as, without limitation, silicon dioxide and other silicon oxides such as TEOS. Furthermore, subsequently formed dielectric layers, e.g., additional layers formed to provide additional interlevel dielectrics for more than two layers of metallization, clearly can benefit from the present inventive technique when more than two layers of metallization are formed.

We claim:

1. A method of fabricating a semiconductor integrated circuit, including the step of planarizing a dielectric layer disposed over a silicon substrate, wherein said planarizing is accomplished by steps comprising dry anisotropic etching of said dielectric layer,
    characterized by the further step of wet etching only the topmost portions of the dielectric layer after the planarizing step, thereby to remove substantially all of the mobile ion contamination from the dielectric layer that is introduced by said planarizing step;
    and thereafter forming contact windows in said dielectric layer.

2. The method of claim 1 wherein the wet etching employs hydrofluoric acid.

3. The method of claim 1 wherein the dielectric layer is of thickness greater than about 600 nm and the topmost portion removed is less than about 100 nm.

4. The method of claim 1 wherein said dry anisotropic etching is reactive ion etching.

5. The method of claim 1 wherein said dielectric layer is a deposited second dielectric layer disposed over a first dielectric layer on which is disposed a first level of metal interconnection.

6. The method of claim 5 wherein the second dielectric layer is PETEOS.

* * * * *